United States Patent [19]

Brander

[11] Patent Number: 4,543,453
[45] Date of Patent: Sep. 24, 1985

[54] ELECTRONIC HEARING AID CONTROL CIRCUIT

[75] Inventor: Richard Brander, Cicero, Ill.

[73] Assignee: Beltone Electronics Corporation, Chicago, Ill.

[21] Appl. No.: 480,454

[22] Filed: Mar. 30, 1983

[51] Int. Cl.[4] .............................. H03F 1/30
[52] U.S. Cl. .................... 179/107 R; 381/68
[58] Field of Search ......... 179/107 R; 381/72, 56, 381/57, 68, 96, 108; 330/96, 97, 102, 127, 282, 291

[56] References Cited

U.S. PATENT DOCUMENTS

| | | | |
|---|---|---|---|
| 3,317,671 | 5/1967 | Mitchell | 179/107 R |
| 3,382,321 | 5/1968 | Lybarger | 381/68 |
| 3,578,913 | 5/1971 | Ufkes | 179/107 R |
| 3,729,588 | 4/1973 | Berland | 179/107 R |
| 3,995,114 | 11/1976 | Marschinke | 179/107 R |

Primary Examiner—Gene Z. Rubinson
Assistant Examiner—L. C. Schroeder
Attorney, Agent, or Firm—Allegretti, Newitt, Witcoff & McAndrews, Ltd.

[57] ABSTRACT

An electronic power control circuit for a hearing aid amplifier. The circuit includes a feedback stage, output stage, and output transducer. The feedback and output stages cooperatively define a current regulator that controls the current of the output stage. A variable resistor is provided for adjusting the maximum signal level that can be applied to the output transducer in the hearing aid. Such adjustment prohibits the output transducer from producing an undesirably loud acoustic output. Adjustment of the variable resistor also simultaneously varies both the quiescent current of the output stage and the hearing aid gain.

12 Claims, 3 Drawing Figures

ELECTRONIC HEARING AID CONTROL CIRCUIT

BACKGROUND OF THE INVENTION

The present invention relates generally to electronic hearing aid control circuits and more particularly to a power level control circuit for a hearing aid amplifier.

Generally, hearing aids incorporate a microphone as an input transducer to receive an acoustic input (sound) and create an electric signal in response. (Alternatively, they may also use an induction coil or a direct electrical connection to produce an input signal.) The electric signal is amplified and transmitted to a receiver that responsively creates an acoustic output (sound) to be heard by the wearer of the hearing aid. For normal sounds, the acoustic output should be a clear but amplified copy of the input signal.

Hearing aids are normally equipped with a gain, or "volume," control. Such a gain control allows the wearer to adjust the amplification of the hearing aid in order to accommodate his needs.

In addition, it is desirable for the hearing aid to limit its output signal for loud input sounds so that the resultant output sound can never become so loud as to be uncomfortable to the wearer. Individuals differ greatly, however, in the sound level that they can comfortably tolerate. Therefore, the level at which the hearing aid limits its output signal should be adjustable for each individual wearer.

A control used to make such an adjustment of maximum output level is often referred to as a power level control. This control is normally adjusted by the person fitting the hearing aid and is not meant to be adjusted by the wearer during use.

Such adjustment typically involves noting the sound level at which the wearer experiences discomfort. This is often referred to as the wearer's loudness discomfort level or tolerance level. The hearing aid power level control is then adjusted so that the hearing aid will not cause a discomforting acoustic output for the wearer, regardless of how large the input signal is.

It has been found that persons with lower loudness discomfort levels normally also require less amplification. Accordingly, it is desirable that adjustment of the power level control will also cause the hearing aid gain to be adjusted. Thus, it is desirable for one adjustment of the pwer level to necessarily cause the gain to be changed to a level that is approximately correct for a particular user. Consequently, the user-operated gain control will be in the appropriate range and require only limited adjustments by the user.

Hearing aids must, of course, provide the wearer with accurate sound reproduction. Thus, it is desirable that the power level control adjust the operating conditions in the hearing amplifier so that, for any setting of the power level control, the hearing aid produces a clear (or "nondistorted") acoustic output signal, as long as the output signal is below the level that will cause discomfort for the wearer.

In addition, it is desirable that a hearing aid require a low level of electric power in operation. Otherwise, a battery that powers the hearing aid will become depleted quickly, requiring frequent replacement. Therefore, it is desirable that the power level control adjust the operating conditions of the hearing aid so that, for any setting of the power level control, the electric power drawn from the battery is low. At the same time, however, the control must maintain the hearing aid in a condition such that it will produce a nondistorted acoustic output signal for normal acoustic input levels.

For ease of use by the person fitting the hearing aid, it is desirable that the hearing aid allow the power level, gain, and operating conditions to be adjusted simultaneously by the operation of a single manual control. Moreover, it is important that the cost of manufacture, and therefore the price to consumers, be kept low. Thus, the power control circuit should preferably require only a small number of relatively simple components.

SUMMARY OF THE INVENTION

In a principal aspect, the present invention is a hearing aid control circuit for setting a predetermined maximum sound pressure level that a hearing aid will produce in response to a loud sound. The control circuit includes an amplifier, feedback stage, output stage, output transducer, variable resistor, and feedback network.

The amplifier receives an electric input signal derived from an input transducer and produces an amplified signal in response. The amplified signal is provided to both the feedback and output stages.

The feedback stage produces a feedback signal in response to the amplified signal. The output stage produces an output signal in response to the amplified signal.

Importantly, the feedback and output stages have a predetermined relationship and thus cooperatively define a current regulator. That is, currents flowing through the feedback and output stages are directly related to one another. In this way, the magnitude of the current in the output stage may be monitored by sensing the current in the feedback stage.

The output signal is supplied to the output transducer. Consequently, the electric output signal is transformed into an acoustic output signal.

A variable resistor (called a power level control) is interconnected between the output transducer and power supply. The variable resistor adjustably limits the maximum electric signal that can be applied to the output transducer. By so limiting the maximum electric signal, the control circuit necessarily limits the maximum acoustic output signal that can be received by the wearer.

The feedback network receives signals from the feedback stage and variable resistor and responsively provides a signal to the amplifier. The signal is dependent upon the setting of the variable resistor and controls both the operating point and gain of the control circuit.

Thus, when an input signal is received by the hearing aid, an amplified acoustic output signal is received by the wearer. As the input signal level increases, the acoustic output signal increases. However, the acoustic output signal is limited and never rises above a predetermined maximum sound pressure level that is determined by the setting of the power level control. The power level control is normally adjusted so that the maximum sound pressure level never exceeds the tolerance level of the wearer.

In another aspect of the present invention, the feedback network is interconnected to the power level control. The feedback network alters the current entering the feedback stage and consequently reduces the quiescent output current drawn by the output stage. This reduction in quiescent current reduces the amount of power drawn from the battery powering the hearing aid in order to extend battery life. At the same time, the reduction in current keeps distortion low for any setting of the power level control.

In another aspect, the feedback network reduces the gain of the control circuit as the power level control is adjusted in order to reduce the maximum output level. In this way, if the power level has been properly adjusted, the gain of the hearing aid will be closer to the level required by a particular wearer.

It is thus an object of the present invention to provide an improved electronic hearing aid control circuit. Another object is an improved control circuit for adjusting the maximum output level of a hearing aid.

Still another object is an improved control circuit that gives a less distorted output signal for all adjustments of the maximum output level. It is also an object to provide a control circuit that uses less power for different maximum output levels and thus reduces the frequency with which a hearing aid battery must be replaced.

Yet another object of the present invention is an improved electronic hearing aid control that may simultaneously reduce the gain and maximum output level of a hearing aid in a more controlled manner. A further object is an improved control circuit in which the maximum output level, gain, and quiescent power consumption may be varied by a single manual adjustment. Still another object of the present invention is an improved control circuit that is more easily manufactured.

These and other objects, features, and advantages of the present invention are discussed or apparent in the following detailed description.

BRIEF DESCRIPTION OF THE DRAWING

A preferred embodiment of the present invention is described herein with reference to the drawing wherein.

DETAILED DESCRIPTION OF A PREFERRED EMBODIMENT

Figure 1:
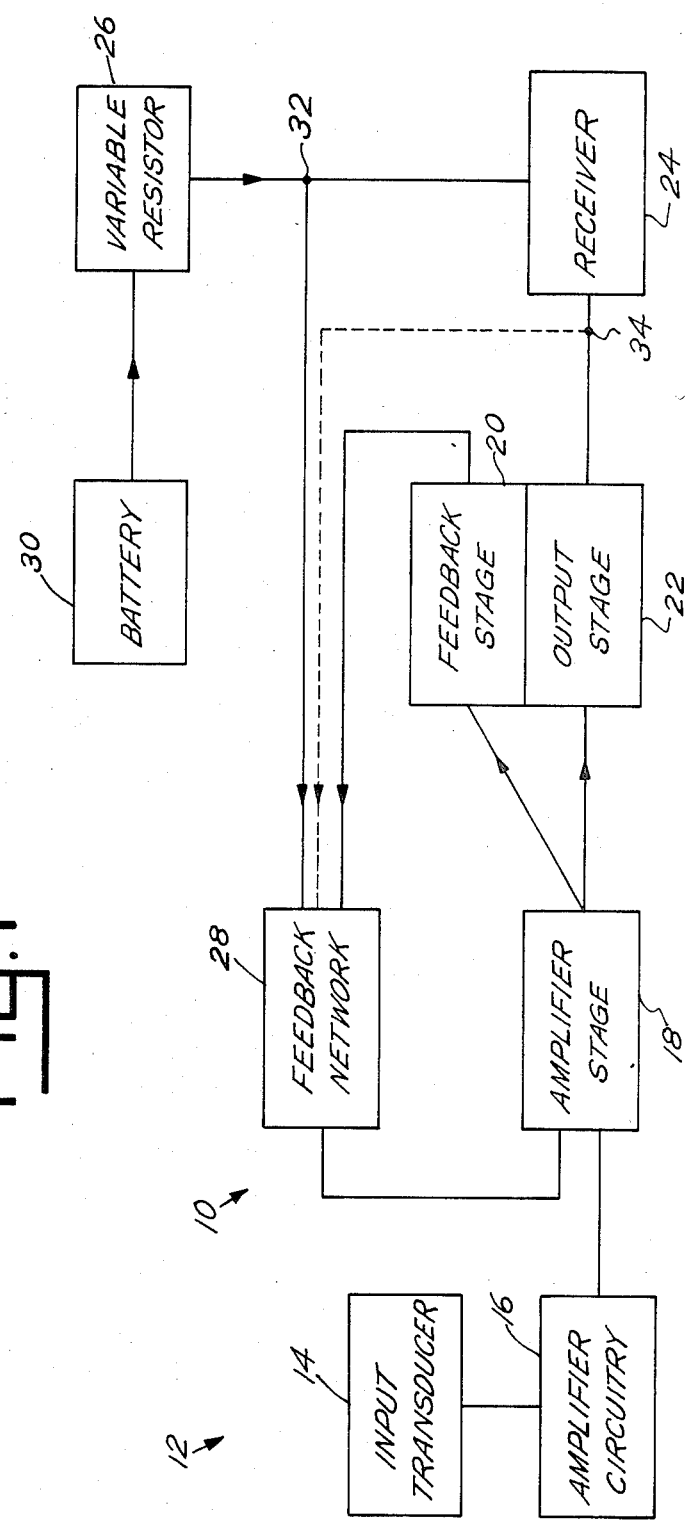
FIG. 1 is a block diagram of the present invention.
Figure 2:
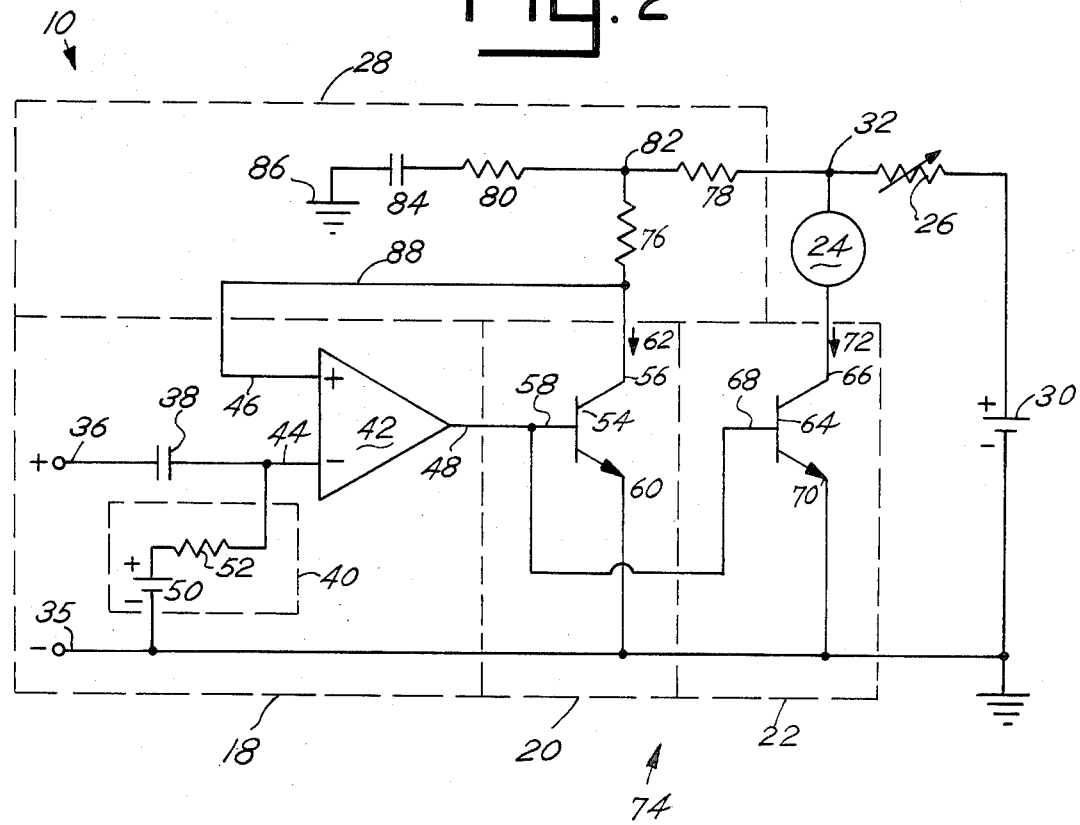
FIG. 2 is a schematic diagram of a preferred embodiment of the invention of FIG. 1.
Figure 3:
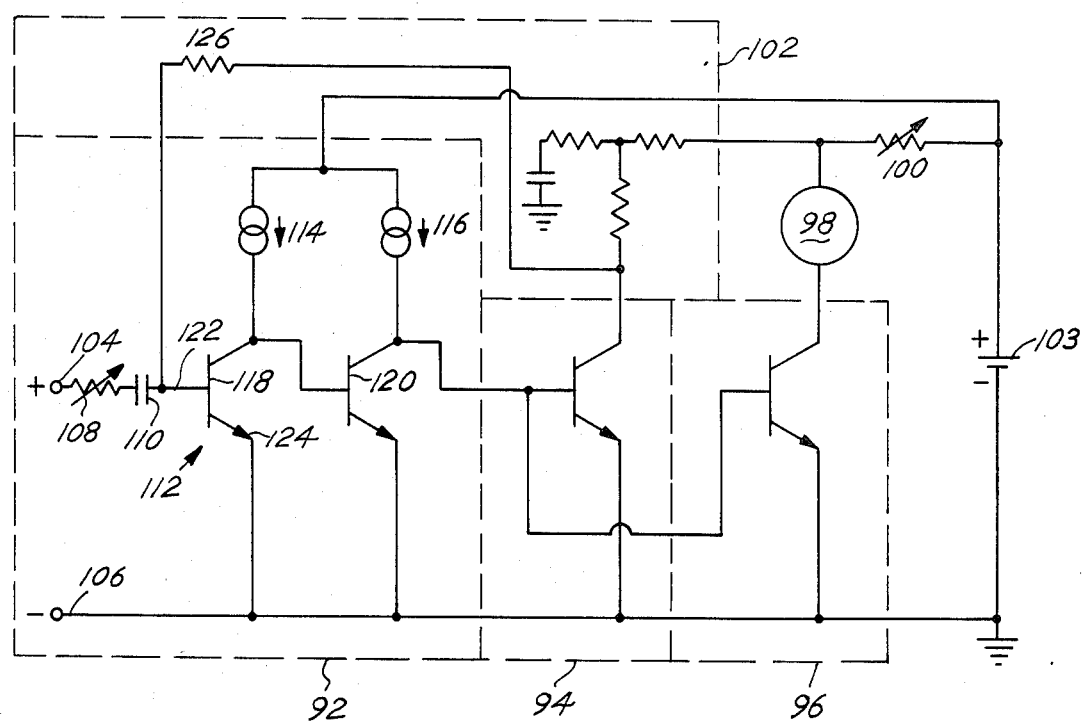
FIG. 3 is a schematic diagram of an alternative to the embodiment shown in FIG. 2.

Referring to FIGS. 1-3, a preferred embodiment of the present invention is shown as an electronic control circuit 10 for a hearing aid 12. When the hearing aid receives an acoustic input signal, an input transducer 14 converts the acoustic input signal to an electric input signal. (FIG. 1.) The electric input signal is then amplified by the amplifier circuitry 16 and applied to the control circuit 10. The control circuit 10 responsively provides an acoustic output signal for the wearer (not shown) of the hearing aid 12.

Normally, a hearing aid has a limited output capability, such that it will not produce a signal having an output level above a predetermined maximum level. Even if the acoustic input signal is extremely loud, the output will not exceed the maximum output level.

Notably, however, when a hearing aid 12 produces a signal at its maximum output level, the output signal is often distorted. Thus, the acoustic output signal is not an accurate replica of the acoustic input signal.

The "proper" maximum output level for a hearing aid is determined by the hearing capacity of the individual wearer. The maximum output level must be great enough such that the acoustic output is a nondistorted replica of all the sounds that are of interest to the wearer. However, the maximum output level must never be so great as to cause discomfort for the wearer.

The control circuit 10 includes an amplifier stage 18, feedback stage 20, output stage 22, receiver (output transducer) 24, variable resistor 26, feedback network 28 and battery 30. The amplifier stage 18 receives the electric input signal, amplifies the signal, and transmits an amplified signal to the feedback and output stages 20, 22. The feedback stage 20 receives the amplified signal and responsively provides a feedback signal to the feedback network 28. The output stage 22 also receives the amplified signal and responsively applies an output signal to the receiver 24. The receiver 24 then provides an acoustic output signal.

The feedback and output stages 20, 22 incorporate matched components so that current in the feedback stage 20 is directly proportional to the current in the output stage 22. An example of a related arrangement is described in U.S. Pat. No. 4,187,472, and the disclosure of this patent is incorporated herein by reference.

The variable resistors 26 is substantially in series with the receiver 24 and interconnects the receiver 24 and battery 30. The maximum signal level that can be applied to the receiver 24 depends on the setting of the variable resistor 26, as well as the battery voltage and quiescent current of the output stage 22.

The feedback stage signal, which is an accurate scaled replica of the output signal, is supplied as one input to the feedback network 28. A second input to the feedback network 28 is connected to a junction 32 between the receiver 24 and variable resistor 26. Alternatively, the second input to the feedback network 28 may be connected to a junction 34 at the output lead of the output stage 22.

The feedback network 28 provides a feedback signal. This feedback signal is thus a function of the DC and AC components of the feedback stage signal (which is a scaled replica of the output signal) and of the voltage developed across the variable resistor 26.

The feedback signal is applied to the amplifier stage 18. As a result, the gain of the control circuit 10 and the quiescent current of the output stage 22 are controlled by the feedback signal which, in turn, is influenced by the setting of the variable resistor 26.

FIG. 2 also shows the amplifier stage 18, feedback stage 20, output stage 22, receiver 24, variable resistor 26, feedback network 28, and battery 30 of the control circuit 10. The amplifier stage 18 includes a pair of input leads 35, 36, a coupling capacitor 38, a biasing voltage network 40, and an operational amplifier 42.

The input leads 35, 36 receive the electric input signal. The coupling capacitor 38 blocks DC current while allowing an AC signal to pass to the input of the operational amplifier 42.

The operational amplifier 42 includes inverting and non-inverting input leads 44, 46 as well as an output lead 48. The inverting input lead 44 is interconnected to the coupling capacitor 38. Thus, if the operational amplifier 42 receives a positive electric input signal at its inverting input lead 44, it responsively effects an amplified signal at the output lead 48 which is negative.

Under normal conditions, the amplitude of the amplified signal at the output lead 48 is larger than the amplitude of the electric input signal. The ratio of the magnitude of the amplified signal to the magnitude of the electric input signal defines a gain of the operational amplifier 42.

The biasing voltage network 40 includes a DC voltage source 50 and resistor 52 connected to the inverting input lead 44 of the operational amplifier 42. The voltage network 50, in conjunction with the balance of the control circuit 10, establishes the quiescent operating point of the feedback stage 20 and output stage 22.

The feedback stage 20 is defined by an NPN feedback transistor 54 having a collector 56, base 58, and emitter 60. The base 58 receives signal from the output lead 48 and accordingly influences the level of the feedback current (represented by the arrow 62).

The output stage 22 is defined by an NPN output transistor 64 having a collector 66, base 68, and emitter 70. Like the base 58 of the feedback transistor 54, the base 68 of the output transistor 64 receives signals from the output lead 48 of the operational amplifier 42. This causes the output current (representd by the arrow 72) to vary. In response, the receiver 24 produces an acoustic output signal (or sound pressure level) that may be sensed by the wearer of the hearing aid 12.

In the preferred embodiment of the present invention, the emitter 70 of the output transistor 64 is 36 times larger than the emitter 60 of the first NPN transistor 54. Such a known relationship between the emitters 60, 70 allows the feedback and output stages 20, 22 to cooperatively define a current regulator 74. Consequently, the feedback current 62 through the collector 56 will always be substantially equal to 1/36 of the output current 72 through the collector 66 whenever both the feedback and output transistors 54, 64 are in their active region of operation. Thus, the output current 72 may be monitored by sensing the feedback current 62.

The battery 30 supplies electric power to the control circuit 10 and to the rest of the hearing aid 13. The variable resistor 26 is essentially connected in series with receiver 24, between the battery 30 and receiver 24. The main function of the variable resistor 26 is to adjust the maximum output limit of the hearing aid 12.

As shown in FIG. 2, the feedback network 28 includes three resistors 76, 78, 80, joined at a junction 82. The resistor 80 is in series with a bypass capacitor 84 which, in turn, is connected to a ground reference 86. The resistor 76 is connected to the collector 56 of the feedback stage 20. The resistor 78 is connected to the junction 32 of the receiver 24 and the variable resistor 26.

A feedback line 88 connects the collector 56 of the feedback stage 20 and resistor 76 to the non-inverting input 46 of the operational amplifier 42. The feedback signal along the feedback line 88 thus contains AC and DC components derived from the feedback stage 20 and modified by the setting of the variable resistor 26.

The operation of the control circuit 10 will be described first for the case where the variable resistor 26 is set to 0 ohms.

In the operation of the control circuit 10, an increase in the input signal voltage at the inverting input 44 of the operational amplifier 42 results in an even larger decrease in the voltage at the output lead 48 connected to the base 58 of feedback transistor 54. As a result, the feedback current 62 at the collector 56 decreases. This decrease in feedback current 62 causes the voltage to increase along the feedback line 88, which is connected to the non-inverting input 46 of operational amplifier 42. As a result, the difference in voltage between the inverting input 44 and the non-inverting input 46 is reduced. This forms a typical feedback system, and the greater the gain of the operational amplifier 42, the smaller will be the difference in voltage.

For a large amplifier gain, the voltage along the feedback line 88 can be assumed to be very nearly equal to the voltage at the inverting input 44, which, in turn, is basically the sum of the AC component of the input signal voltage plus the DC voltage of voltage source 50. Thus, under feedback control, the DC component of feedback current 62 will be regulated so that (with the variable resistor 26 set to 0 ohms) the voltage of battery 30 minus the voltage drops produces by the DC component of feedback current 62 flowing through the resistors 76, 78 will very nearly equal the voltage of the source 50.

Also, under feedback control, the AC component of the feedback current 62 will be regulated so that (with the variable resistor 26 set at 0 ohms) the voltage produced by the AC component of feedback current 62 flowing through the resistor 76 and the parallel combination of the resistor 80 and the resistor 78 will very nearly equal the AC component of the signal voltage. As a well-known benefit of such feedback, non-linearities in the amplification characteristics of the operational amplifier 42 and the feedback transistor 54 are moderated. Accordingly, the AC component of feedback current 62 is a substantially non-distorted copy of the original electric input signal.

Since the output current 72 from output transistor 64 is a fixed multiple of the feedback current 72, the DC component of the output current 72 is indirectly controlled by the feedback network 28 described above. Also, the AC component of the output current 72 will be a substantially non-distorted copy of the original electric input signal as long as the feedback transistor 54 and output transistor 64 remain within their active operating regions.

When the input signal is very large, however, the output transistor 64 will be driven into the saturated and cutoff regions of operation. In the cutoff region, the output current 72 goes to zero and no further decrease in current is possible. In the saturated region, the output voltage goes to the saturation voltage of nearly zero volts, and no further decrease in voltage is possible. These two conditions occur on opposite extremes of the signal wave form and together limit the maximum output signal supplied by the output stage 22. As a result, such conditions limit the acoustic output from receiver 24 to the wearer.

As the input signal level increases, the output signal will pass from a linear, nondistorted condition to the condition where first one side and then the other side of the waveform of the output signal is limited. It is desirable to have the quiescent output current 72 adjusted so that limiting occurs on both sides of the signal waveform at the same time. This maximizes the ranges of input signal levels giving linear, nondistorted operation.

Beyond the point of onset of waveform limiting, a point is reached where further increases in input signal level produce no further changes in output signal level. This defines the maximum output capability of the hearing aid 12.

When the variable resistor 26 increased from 0 ohms, the output signal is not applied only to the receiver 24, but rather is applied to both the receiver 24 and variable resistor 26 in series. As a result, the limited maximum output signal is divided between the receiver 24 and the variable resistor 26; the maximum output signal actually applied to the receiver 24 is reduced, causing a reduced maximum acoustic output from the receiver 24.

Also, when the variable resistor 26 is increased, the DC voltage at the junction 32 is no longer equal to the DC voltage of battery 30, but is reduced by the voltage drop produced by both the DC feedback current and the DC output current flowing through the variable resistor 26. As a result, the DC components of the feedback current 62 and output current 72 will decrease from their values obtained when the variable resistor 26 is set to 0 ohms. This reduces the amount of power required from the battery 30, extending its life. At the same time, the reduction in quiescent output current 72 acts to maintain the condition that clipping begins to occur on both sides of the output waveform at nearly the same input level.

Another effect produced when the value of the variable resistor 26 is increased is that an AC voltage appears at the node 32, which is produced by the output current 72 flowing through the variable resistor 26. This voltage acts to increase the amount of feedback applied to the operational amplifier 42 and, as a result, the gain of the control circuit 10 is reduced. If resistor 76 is 0 ohms, as the variable resistor 26 is varied over its range, the change in gain, expressed in decibels, will very nearly equal the change in output level, expressed in decibels. If, instead, resistor 80 is 0 ohms, as the variable resistor 26 is varied over its range, the gain will change very little. The range of change of gain relative to the range of change in output level can be adjusted by suitable choice of values for the resistors 76, 80.

The circuit shown in FIG. 2 uses a small number of components, allowing the circuit to be manufactured quickly and inexpensively. The appropriate values of the components shown in FIG. 1 are listed below.

Variable resistor 26: Maximum value of 8 kilohms.
Battery 30: 1.30 volts (with 10 ohms internal resistance).
Coupling capacitor 38: 2.2 microfarads.
Operational amplifier 42: National LM-10 operational amplifier.
Direct current voltage source 50: 0.66 volt.
Resistor 52: 10 kilohms.
K (size ratio of emitter 70 to emitter 60): 36.
Resistor 76: 1.0 kilohm.
Resistor 78: 64 kilohms.
Resistor 80: 910 ohms.
Bypass capacitor 84: 2.2 microfarads.

The feedback and output transistors 54, 64 have current amplification ratios ("betas") of approximately 100. The receiver 24 is typical of those used by the hearing aid industry. The preferred embodiment includes a low power magnetic transducer, Model No. BK-1604, supplied by Knowles Electronics, Inc. of Franklin Park, Ill.

The control circuit 10 shown in FIG. 2 exhibits superior operating characteristics. The output current 72 under quiescent conditions ($I_{72q}$) is given by the following formula:

$$K\left(\frac{V_{30} - V_{50}}{R_{26}(1 + K) + R_{76} + R_{78}}\right)$$

In the formula, each of the elements represents a value (in volts or ohms) of a particular component. The subscript of each element corresponds to a number previously ascribed to a component and thus identifies the component whose value should be inserted. For the preferred embodiment shown in FIG. 1, if $R_{26}$ is set to 0 ohms, $I_{72q}$ equals approximately 355 micro amps. If $R_{26}$ is set to 8 kilohms, $I_{72q}$ equals approximately 64 microamps.

Using the same notation scheme as above, the overal circuit transconductance $\left(\frac{\partial (i_{72})}{\partial (V_{36})}\right)$ is given by:

$$-K\left(\frac{1 + R_{78}/R_{80}}{KR_{26} + R_{76} + R_{78} + (R_{76}R_{78})/R_{80}}\right)$$

For the control circuit 10, the overall transconductance equals approximately $-0.0187$ mho for $R_{26}$ set to 0 ohms and equal approximately $-0.0060$ mho for $R_{26}$ set to 8 kilohms.

The minimum output current 72 is zero. The maximum output current 72 equals:

$$I_{72q} + \frac{V_{30} - V_{S64} - I_{72q}(R_{24} + R_{26})}{Z_{24} + R_{26}}$$

where $Z_{24}$ is the AC impedance in the mid-audio range of the receiver 24, $R_{24}$ is the DC resistance of the receiver 24, and $V_{S64}$ is the saturation voltage of the output transistor 64. For the preferred embodiment, $Z_{24}$ equals 2.5 kilohms, $R_{24}$ equals 1.0 kilohm and $V_{S64}$ equals 0.05 volt. The maximum output current 72 equals approximately 713 microamps for $R_{26}$ set to 0 ohms and equals approximately 128 microamps for $R_{26}$ set to 8 kilohms.

The Saturation Sound Pressure Level (SSPL) of the control circuit 10 (a measure of the maximum output that the control circuit 10 can produce) is given by the following:

$$SSPL = SSPL(R_{26} = 0) - 20 \log_{10}\left(1 + \frac{R_{26}(1 + K)}{R_{76} + R_{78}}\right) dB$$

where SSPL ($R_{26}=0$) denotes the Saturation Sound Pressure Level produced when $R_{26}$ equals 0 ohms. For the control circuit 10, the range of SSPL reduction as $R_{26}$ is varied from 0 ohms to 8 kilohms approximately equals 15 dB.

The gain (A) of the control circuit 10 is given by:

$A(R_{26} = 0) -$ $$20 \log_{10}\left(1 + \frac{R_{26} K R_{80}}{R_{76} R_{80} + R_{76} R_{78} + R_{80} R_{78}}\right) dB$$

where $A(R_{26}=0)$ denotes the hearing aid gain when $R_{26}$ equals 0 ohms. For the control circuit 10, the range of reduction of A as $R_{26}$ is varied from 0 ohms to 8 kilohms is approximately 10 dB.

An alternative form of the present invention is shown in FIG. 3. FIG. 3, like FIG. 2, shows a control circuit 90 having an amplifier stage 92, feedback stage 94, output stage 96, receiver 98, variable resistor 100, feedback network 102, and battery 103. The feedback stage 94, output stage 96, receiver 98, variable resistor 100, and feedback network 102 are substantially similar to the similarly-named components of FIG. 1 and need not be explained further.

The amplifier stage 92 shown in FIG. 3, however, differs from the amplifier stage 18 of FIG. 2 in that no independent voltage source, such as the DC voltage source 50, is required. Accordingly, the configuration shown in FIG. 3 may be less expensive to manufacture than that shown in FIG. 2.

The amplifier stage 92 includes input leads 104, 106, a variable input resistor 108, coupling capacitor 110 and amplifier network 112. An electric input signal is applied to the input leads 104, 106, through the input resistor 108 and coupling capacitor 110, and allowed to pass to the amplifier network 112.

The input resistor 108 may be a variable resistor and function as a wearer-operated gain control. The coupling capacitor 110 blocks any direct current component of the electrical input signal from the amplifier network 112.

The amplifier network 112 includes two 40 microamp direct current sources 114, 116 and two amplifying transistors 118, 120, interconnected as shown in FIG. 3. The amplifying transistor 118 has a base 122 and emitter 124.

Notably, the coupling capacitor 110 and a resistor 126 are interconnected to the base 122 of the amplifying transistor 118. The resistor 126 of FIG. 3 supplies current flowing into the base 122 from the feedback stage 94.

The current flowing into base 122 places transistor 118 in its active operating region and develops a voltage develops between the base 122 and emitter 124 that approximates the voltage supplied by the biasing voltage network 40 of FIG. 2. Even though no separate voltage source (such as the direct current voltage source 50 shown in FIG. 2) is required, the forward biased base to emitter voltage of the transistor 118 (approximately 0.60 volts) accomplishes the same purpose. Accordingly, the amplifier network 112 performs much the same function as the operational amplifier 42.

The approximate values for components in the control circuit 90 are given below:
  Variable input resistor 108: Maximum value of 100 kilohms.
  Coupling capacitor 110: 2.2 microfarads.
  Resistor 126: 50 kilohms.

The control circuit 90 may be implemented with standard integrated circuits and operates with substantially the same results as the control circuit 10 shown in FIG. 2.

In yet another form of the present invention, the control circuit is identical to that shown in FIG. 3 except that the second input to the feedback network 102 is connected to the output terminal of the output stage 96 rather than to the junction of receiver 98 and variable resistor 100. This connection offers a possible advantage in driving the receiver 98 from a lower effective output impedance. However, this impedance will vary with the setting of the variable resistor 100. The values of the components in the feedback network can be selected for this circuit to provide the same kind of favorable variations in output quiescent current and gain when the variable resistor (power level control) 100 is adjusted as in the other forms of the present invention.

A preferred embodiment of the present invention has been described herein. It is to be understood, of course, that changes and modifications may be made in the embodiment without departing from the true scope and spirit of the present invention as defined by the appended claims.

What is claimed is:

1. A hearing aid control circuit for setting a predetermined maximum sound pressure level that a hearing aid will produce in response to a large electric input signal comprising, in combination:

power source means for providing electric power to said hearing aid control circuit;

amplifier means for receiving said electric input signal and producing an amplified signal in response thereto;

feedback stage means, interconnected to said amplifier means, for receiving said amplified signal and producing a feedback signal in response to said amplified signal, said feedback signal including a feedback current;

output stage means, interconnected to said amplifier means, for receiving said amplified signal and producing an output signal in response to said amplified signal, said output signal defining a maximum output signal level and including an output current;

current regulator means, cooperatively defined by said feedback stage means and output stage means, for maintaining said feedback and output currents in a substantially proportional relationship, whereby said output current may be monitored by sensing said feedback current;

output transducer means, interconnected to said output stage means, for receiving said output signal and responsively providing an acoustic output;

a variable resistor, having a variable setting and interconnected between said power source means and said output transducer means, for adjustably limiting said maximum output signal level applied to said output transducer means; and feedback line means, interconnecting said feedback stage means and variable resistor to said amplifier means, for exerting control over said output signal, said control being dependent upon said setting of said variable resistor.

2. A hearing aid control circuit as claimed in claim 1 wherein said output signal includes both quiescent and signal components and said feedback line means control both said quiescent and signal components.

3. A hearing aid control circuit as claimed in claim 1 wherein said feedback line means includes at least one resistor interconnecting said feedback stage means and variable resistor to said amplifier means.

4. A hearing aid control circuit as claimed in claim 3 wherein said power source means defines a ground potential and said feedback line means further includes a capacitor for shunting a portion of said signal component to said ground potential.

5. A hearing aid control circuit as claimed in claim 1 wherein said feedback stage means and output stage means each include a transistor.

6. A hearing aid control circuit as claimed in claim 5 wherein said amplifier means includes an amplifier output and said transistors of said feedback stage means and output stage means each include a base interconnected to said amplifier stage output.

7. A hearing aid control circuit for setting a predetermined maximum sound pressure level that a hearing aid will produce in response to a large electric input signal comprising, in combination:

power source means for providing electric power to said hearing aid control circuit;

amplifier means for receiving said electric input signal and producing an amplified signal in response thereto;

feedback stage means, interconnected to said amplifier means, for receiving said amplified signal and producing a feedback signal in response to said amplified signal, said feedback signal including a feedback current;

output stage means, interconnected to said amplifier means, for receiving said amplified signal and producing an output signal in response to said amplified signal, said output signal defining a maximum output signal level and including an output current;

current regulator means, cooperatively defined by said feedback stage means and output stage means, for maintaining said feedback and output currents in a substantially proportional relationship, whereby said output current may be monitored by sensing said feedback current;

output transducer means, interconnected to said output stage means, for receiving said output current and responsively providing an acoustic output;

a variable resistor, having a variable setting and connected in series with said output transducer means, for adjustably limiting said maximum output signal level applied to said output transducer means; and feedback line means, interconnecting said feedback stage means and output stage means to said amplifier for exerting control over said output signal, said control being dependent upon said setting of said variable resistor.

8. A hearing aid control circuit as claimed in claim 7 wherein said output signal includes both quiescent and signal components and said feedback line means controls both said quiescent and signal components.

9. A hearing aid control circuit as claimed in claim 7 wherein said feedback line means includes at least one resistor interconnecting said feedback stage means and output stage means to said amplifier means.

10. A hearing aid control circuit as claimed in claim 9 wherein said power source means defines a ground potential and said feedback line means further includes a capacitor for shunting a portion of said signal component to said ground potential.

11. A hearing aid control circuit as claimed in claim 7 wherein said feedback stage means and output stage means each include a transistor.

12. A hearing aid control circuit as claimed in claim 11 wherein said amplifier means includes an amplifier output and said transistors of said feedback stage means and output stage means each include a base interconnected to said amplifier stage output.

* * * * *